(12) United States Patent
Parker et al.

(10) Patent No.: US 8,212,548 B2
(45) Date of Patent: Jul. 3, 2012

(54) BRANCH METER WITH CONFIGURABLE SENSOR STRIP ARRANGEMENT

(75) Inventors: Aaron Parker, Happy Valley, OR (US); Gregory P. Dolim, Tigard, OR (US)

(73) Assignee: Veris Industries, LLC, Portland, OR (US)

( * ) Notice: Subject to any disclaimer, the term of this patent is extended or adjusted under 35 U.S.C. 154(b) by 259 days.

(21) Appl. No.: 12/455,512

(22) Filed: Jun. 2, 2009

(65) Prior Publication Data

US 2009/0295370 A1   Dec. 3, 2009

Related U.S. Application Data

(60) Provisional application No. 61/130,763, filed on Jun. 2, 2008.

(51) Int. Cl.
*G01R 21/00* (2006.01)
*G01R 19/00* (2006.01)

(52) U.S. Cl. .................. 324/140 R; 324/76.11; 324/126; 324/127; 324/142

(58) Field of Classification Search .................. None
See application file for complete search history.

(56) References Cited

U.S. PATENT DOCUMENTS

| | | |
|---|---|---|
| 1,100,171 A | 6/1914 | Brown |
| 1,455,263 A | 5/1923 | Oberfell |
| 1,569,723 A | 1/1926 | Dickinson |
| 1,800,474 A | 4/1931 | Scherer |
| 1,830,541 A | 11/1931 | Harris |
| 1,871,710 A | 8/1932 | Lenehan |
| 2,059,594 A | 11/1936 | Massa, Jr. |
| 2,411,405 A | 11/1946 | Yuhas |
| 2,412,782 A | 12/1946 | Palmer |
| 2,428,613 A | 10/1947 | Boyajian |
| 2,428,784 A | 10/1947 | Cole |
| 2,512,070 A | 6/1950 | Nelson et al. |
| 2,663,190 A | 12/1953 | Ilgenfrit |
| 2,746,295 A | 5/1956 | Lubkin |
| 2,802,182 A | 8/1957 | Godshalk et al. |
| 2,852,739 A | 9/1958 | Hansen |
| 2,943,488 A | 7/1960 | Strobel et al. |
| 3,190,122 A | 6/1965 | Edwards |
| 3,243,674 A | 3/1966 | Ebert |
| 3,287,974 A | 11/1966 | Ciemochowski |
| 3,374,434 A | 3/1968 | Perry |
| 3,493,760 A | 2/1970 | Hoadley |
| 3,512,045 A | 5/1970 | Sanger et al. |
| 3,584,294 A | 6/1971 | Siwko |

(Continued)

FOREIGN PATENT DOCUMENTS

EP   1531334 A2   5/2005

(Continued)

OTHER PUBLICATIONS

AT91M42800A Summary, "AT91 ARM Thumb Microcontrollers," Atmel, Feb. 2002.

(Continued)

*Primary Examiner* — Vinh Nguyen

(74) *Attorney, Agent, or Firm* — Chernoff Vilhauer McClung & Stenzel, LLP

(57) ABSTRACT

A power monitoring system configurable to monitor electrical energy sensed by multiple sensors of one or more sensor arrays which may be organized in one of several array arrangements.

16 Claims, 11 Drawing Sheets

U.S. PATENT DOCUMENTS

| | | |
|---|---|---|
| 3,593,078 A | 7/1971 | Domshy et al. |
| 3,696,288 A | 10/1972 | Carman |
| 3,728,705 A | 4/1973 | Atkins |
| 3,769,548 A | 10/1973 | Pardue |
| 3,772,625 A | 11/1973 | Raupach |
| 3,861,411 A | 1/1975 | Mitchell et al. |
| 3,955,701 A | 5/1976 | Fisch |
| 3,976,924 A | 8/1976 | Vanjani |
| 4,001,647 A | 1/1977 | Klein et al. |
| 4,001,758 A | 1/1977 | Esper et al. |
| 4,007,401 A | 2/1977 | Kimmel et al. |
| 4,030,058 A | 6/1977 | Riffe et al. |
| 4,048,605 A | 9/1977 | McCollum |
| 4,096,436 A | 6/1978 | Cook et al. |
| 4,107,519 A | 8/1978 | Bicek |
| D249,883 S | 10/1978 | Collins |
| 4,124,030 A | 11/1978 | Roberts |
| 4,151,578 A | 4/1979 | Bell |
| 4,158,217 A | 6/1979 | Bell |
| 4,158,810 A | 6/1979 | Leskovar |
| 4,177,496 A | 12/1979 | Bell et al. |
| 4,198,595 A | 4/1980 | Milkovic |
| 4,207,604 A | 6/1980 | Bell |
| 4,215,278 A | 7/1980 | Barbier et al. |
| 4,227,419 A | 10/1980 | Park |
| 4,241,237 A | 12/1980 | Paraskevakos et al. |
| 4,249,264 A | 2/1981 | Crochet et al. |
| 4,250,449 A | 2/1981 | Shum |
| 4,253,336 A | 3/1981 | Pietzuch |
| 4,258,348 A | 3/1981 | Belfer et al. |
| 4,297,741 A | 10/1981 | Howell |
| 4,328,903 A | 5/1982 | Baars |
| 4,354,155 A | 10/1982 | Speidel et al. |
| 4,359,672 A | 11/1982 | Hart |
| 4,362,580 A | 12/1982 | Kane et al. |
| 4,363,061 A | 12/1982 | Vaerewyck et al. |
| 4,371,814 A | 2/1983 | Hannas |
| 4,373,392 A | 2/1983 | Nagamoto |
| 4,384,289 A | 5/1983 | Stillwell et al. |
| 4,386,280 A | 5/1983 | Ricaud et al. |
| 4,388,668 A | 6/1983 | Bell et al. |
| 4,393,714 A | 7/1983 | Schmidt |
| 4,398,426 A | 8/1983 | Park et al. |
| 4,408,175 A | 10/1983 | Nelson et al. |
| 4,413,193 A | 11/1983 | Crockett |
| 4,413,230 A | 11/1983 | Miller |
| 4,426,673 A | 1/1984 | Bell et al. |
| 4,432,238 A | 2/1984 | Tward |
| 4,491,790 A | 1/1985 | Miller |
| 4,492,919 A | 1/1985 | Milkovic |
| 4,495,463 A | 1/1985 | Milkovic |
| 4,506,199 A | 3/1985 | Asche |
| 4,558,310 A | 12/1985 | McAllise |
| 4,558,595 A | 12/1985 | Kompelien |
| 4,574,266 A | 3/1986 | Valentine |
| 4,605,883 A | 8/1986 | Cockroft |
| 4,621,532 A | 11/1986 | Takagi et al. |
| 4,660,407 A | 4/1987 | Takami et al. |
| 4,709,339 A | 11/1987 | Fernandes |
| 4,739,229 A | 4/1988 | Heiler, Jr. |
| 4,746,809 A | 5/1988 | Coleman et al. |
| 4,754,365 A | 6/1988 | Kazahaya |
| 4,757,416 A | 7/1988 | Wilkerson |
| 4,758,774 A | 7/1988 | Crawford et al. |
| 4,758,962 A | 7/1988 | Fernandes |
| 4,783,748 A | 11/1988 | Swarztrauber et al. |
| 4,794,327 A | 12/1988 | Fernandes |
| 4,808,910 A | 2/1989 | Kessi |
| D301,331 S | 5/1989 | Rhodin |
| 4,851,803 A | 7/1989 | Hahn |
| 4,855,671 A | 8/1989 | Fernandes |
| 4,874,904 A | 10/1989 | DeSanti |
| 4,885,655 A | 12/1989 | Springer et al. |
| 4,887,018 A | 12/1989 | Libert |
| 4,890,318 A | 12/1989 | Crane et al. |
| 4,926,105 A | 5/1990 | Mischenko et al. |
| 4,939,451 A | 7/1990 | Baran et al. |
| 4,944,187 A | 7/1990 | Frick et al. |
| 4,956,588 A | 9/1990 | Ming |
| 4,970,476 A | 11/1990 | Kitagawa |
| 4,972,167 A | 11/1990 | Fujioka |
| 4,991,050 A | 2/1991 | Heberlein, Jr. et al. |
| 4,992,709 A | 2/1991 | Griffin |
| 4,999,575 A | 3/1991 | Germer |
| 5,003,278 A | 3/1991 | May |
| 5,006,846 A | 4/1991 | Granville |
| 5,014,908 A | 5/1991 | Cox |
| 5,039,970 A | 8/1991 | Cox |
| 5,051,601 A | 9/1991 | Atobe et al. |
| 5,066,904 A | 11/1991 | Bullock |
| 5,079,510 A | 1/1992 | Komatsu et al. |
| D323,815 S | 2/1992 | Bouteiller |
| 5,099,193 A | 3/1992 | Moseley et al. |
| 5,122,735 A | 6/1992 | Porter et al. |
| 5,148,348 A | 9/1992 | White |
| 5,181,026 A | 1/1993 | Granville |
| 5,196,784 A | 3/1993 | Estes, Jr. |
| D335,488 S | 5/1993 | Suzuki et al. |
| 5,223,790 A | 6/1993 | Baran et al. |
| 5,267,122 A | 11/1993 | Glover et al. |
| 5,296,819 A | 3/1994 | Kuroiwa et al. |
| 5,311,138 A | 5/1994 | Ott et al. |
| 5,317,274 A | 5/1994 | Nakagawa et al. |
| 5,323,256 A | 6/1994 | Banks |
| 5,337,206 A | 8/1994 | Kadah et al. |
| 5,359,273 A | 10/1994 | Fluckiger |
| 5,365,462 A | 11/1994 | McBean |
| 5,377,128 A | 12/1994 | McBean |
| D354,945 S | 1/1995 | Dellavecchia et al. |
| 5,385,060 A | 1/1995 | Wang |
| 5,391,983 A | 2/1995 | Lusignan et al. |
| 5,397,970 A | 3/1995 | Rowlette et al. |
| 5,410,920 A | 5/1995 | Westwick |
| 5,426,360 A | 6/1995 | Maraio et al. |
| 5,430,438 A | 7/1995 | Joos et al. |
| 5,444,183 A | 8/1995 | Gehrs et al. |
| 5,450,765 A | 9/1995 | Stover |
| 5,467,012 A | 11/1995 | Nystrom |
| 5,471,359 A | 11/1995 | Simpson et al. |
| 5,473,234 A | 12/1995 | Richardson |
| 5,502,374 A | 3/1996 | Cota |
| 5,548,209 A | 8/1996 | Lusignan et al. |
| 5,563,506 A | 10/1996 | Fielden et al. |
| 5,572,073 A | 11/1996 | Burgess et al. |
| 5,578,927 A | 11/1996 | Perelle |
| 5,592,989 A | 1/1997 | Lynn et al. |
| 5,596,652 A | 1/1997 | Piatek et al. |
| 5,604,315 A | 2/1997 | Briefer et al. |
| 5,612,499 A | 3/1997 | Andrew et al. |
| 5,677,476 A | 10/1997 | McCarthy et al. |
| 5,705,989 A | 1/1998 | Cota et al. |
| 5,712,558 A | 1/1998 | Saint-Cyr et al. |
| 5,753,983 A | 5/1998 | Dickie et al. |
| 5,784,249 A | 7/1998 | Pouliot |
| 5,808,848 A | 9/1998 | Pollman et al. |
| 5,844,138 A | 12/1998 | Cota |
| 5,861,683 A | 1/1999 | Engel et al. |
| 5,880,677 A | 3/1999 | Lestician |
| 5,880,918 A | 3/1999 | Horbelt et al. |
| 5,905,439 A | 5/1999 | Mcintyre |
| 5,909,087 A | 6/1999 | Bryde et al. |
| 5,920,190 A | 7/1999 | Peterson et al. |
| 5,920,191 A | 7/1999 | Maniero et al. |
| 5,922,939 A | 7/1999 | Cota |
| 5,994,892 A | 11/1999 | Turino et al. |
| 5,995,911 A | 11/1999 | Hart |
| 6,005,760 A | 12/1999 | Holce et al. |
| D419,964 S | 2/2000 | Holce et al. |
| 6,020,702 A | 2/2000 | Farr |
| 6,029,524 A | 2/2000 | Klauder et al. |
| 6,044,430 A | 3/2000 | MacDonald |
| 6,046,550 A | 4/2000 | Ference et al. |
| 6,064,192 A | 5/2000 | Redmyer |
| 6,091,023 A | 7/2000 | O'Donnell |
| 6,122,972 A | 9/2000 | Crider |
| 6,124,791 A | 9/2000 | Wolf |
| D431,534 S | 10/2000 | Holce et al. |

| | | | |
|---|---|---|---|
| 6,133,709 A | 10/2000 | Puchianu | |
| 6,133,723 A | 10/2000 | Feight | |
| 6,137,418 A | 10/2000 | Zuercher et al. | |
| 6,146,109 A | 11/2000 | Davis et al. | |
| 6,219,216 B1 | 4/2001 | Holce et al. | |
| 6,236,949 B1 | 5/2001 | Hart | |
| 6,269,317 B1 | 7/2001 | Schachner et al. | |
| 6,308,140 B1 | 10/2001 | Dowling et al. | |
| 6,330,516 B1 | 12/2001 | Kammeter | |
| 6,331,821 B1 | 12/2001 | Holce et al. | |
| 6,344,951 B1 | 2/2002 | Sato et al. | |
| 6,351,206 B1 | 2/2002 | Schweiger et al. | |
| 6,373,238 B2 | 4/2002 | Lewis et al. | |
| 6,377,430 B2 | 4/2002 | Holce et al. | |
| 6,380,696 B1 | 4/2002 | Sembhi et al. | |
| 6,384,946 B1 | 5/2002 | Pitsch et al. | |
| 6,404,166 B1 | 6/2002 | Puchianu | |
| 6,414,241 B1 | 7/2002 | O'Donnell | |
| D466,078 S | 11/2002 | Bowman | |
| 6,496,378 B2 | 12/2002 | Holce et al. | |
| 6,504,357 B1 | 1/2003 | Hemminger et al. | |
| 6,504,695 B1 | 1/2003 | Holce et al. | |
| 6,549,859 B1 | 4/2003 | Ward | |
| 6,591,482 B1 | 7/2003 | Fleege et al. | |
| D478,313 S | 8/2003 | Bowman | |
| 6,615,147 B1 | 9/2003 | Jonker et al. | |
| 6,636,028 B2 | 10/2003 | Lavoie et al. | |
| 6,657,424 B1 | 12/2003 | Voisine et al. | |
| 6,724,600 B2 | 4/2004 | Holce et al. | |
| 6,737,854 B2 | 5/2004 | Bruno et al. | |
| 6,756,776 B2 | 6/2004 | Perkinson et al. | |
| 6,774,803 B1 | 8/2004 | Tiffin | |
| 6,809,509 B2 | 10/2004 | Bruno et al. | |
| 6,815,942 B2 | 11/2004 | Randall et al. | |
| 6,825,771 B2 | 11/2004 | Bruno et al. | |
| 6,856,515 B2 | 2/2005 | Holce et al. | |
| 6,861,683 B2 | 3/2005 | Rissing et al. | |
| 6,871,827 B2 | 3/2005 | Petak et al. | |
| 6,888,712 B2 | 5/2005 | Holce et al. | |
| 6,889,271 B1 | 5/2005 | Germer et al. | |
| 6,937,003 B2 | 8/2005 | Bowman et al. | |
| 6,950,292 B2 | 9/2005 | Holce et al. | |
| 6,988,043 B1 | 1/2006 | Randall | |
| 7,006,934 B2 | 2/2006 | Jonker et al. | |
| 7,053,497 B2 | 5/2006 | Sodemann et al. | |
| 7,157,899 B2 | 1/2007 | Bruno | |
| 7,161,345 B2 * | 1/2007 | Bruno | 324/142 |
| 7,174,261 B2 * | 2/2007 | Gunn et al. | 702/62 |
| 7,193,428 B1 | 3/2007 | Baron et al. | |
| 7,212,930 B2 | 5/2007 | Bruno | |
| 7,221,145 B2 | 5/2007 | Bowman et al. | |
| 7,230,414 B2 | 6/2007 | Bruno | |
| 7,239,810 B2 | 7/2007 | Seely et al. | |
| 7,274,187 B2 | 9/2007 | Loy | |
| 7,282,889 B2 | 10/2007 | Freed et al. | |
| 7,310,049 B2 | 12/2007 | Bowman | |
| 7,312,686 B2 | 12/2007 | Bruno | |
| 7,330,022 B2 | 2/2008 | Bowman et al. | |
| 7,333,345 B2 | 2/2008 | Holce et al. | |
| 7,352,287 B2 | 4/2008 | Rupert | |
| 7,359,809 B2 | 4/2008 | Bruno | |
| 7,362,232 B2 * | 4/2008 | Holle et al. | 340/667 |
| 7,447,603 B2 | 11/2008 | Bruno | |
| 7,474,088 B2 * | 1/2009 | Bowman et al. | 324/142 |
| 2004/0183522 A1 * | 9/2004 | Gunn et al. | 324/126 |
| 2004/0227503 A1 | 11/2004 | Bowman et al. | |
| 2005/0240362 A1 | 10/2005 | Randall | |
| 2006/0085144 A1 | 4/2006 | Slota et al. | |
| 2006/0103548 A1 | 5/2006 | Borkowski et al. | |
| 2006/0164096 A1 | 7/2006 | Kwon | |
| 2006/0181242 A1 | 8/2006 | Freed et al. | |
| 2009/0115400 A1 | 5/2009 | Hunter | |
| 2009/0115620 A1 | 5/2009 | Hunter et al. | |

FOREIGN PATENT DOCUMENTS

JP      5083776      4/1993

OTHER PUBLICATIONS

Description of KT® 6300, 6400 Split-Core kW/kWH Transducers . . . Enercept KT®, 1 page by Hawkeye® (by Veris Industries, Inc.), at least one year prior to filing date (1997) (unavailable month).

Ganssie, "Interrupt Latency," Embedded.com, Article.. jhmtl?articleID=9900320, Aug. 26, 2004 <www.embedded.com/show>.

* cited by examiner

BRANCH METER WITH CONFIGURABLE SENSOR STRIP ARRANGEMENT

CROSS-REFERENCE TO RELATED APPLICATIONS

This application claims the benefit of U.S. Provisional App. No. 61/130,763, filed Jun. 2, 2008.

BACKGROUND OF THE INVENTION

The present invention relates to a power monitoring system.

Referring to FIG. 1, many electrical power distribution systems include a panel enclosure 10 into which is provided electrical power using one or more sets of wires 12. The electrical power may have any voltage, any current, and any number of phases (e.g., single phase, two phases, or three phases). Each phase of the electrical power to the power panel is normally provided to a separate bus bar 14a, 14b, and 14c, which are normally elongate conductors within the power panel 10. A plurality of circuit breakers 16a, 16b, and 16c, etc., which trip or otherwise selectively disconnect electrical power, are electrically interconnected between one or more of the bus bars 14a, 14b, and 14c, and respective loads 18 external to the power panel 10. In many power panels 10 the circuit breakers 16 are vertically aligned in one or more strips. When the load 18 interconnected to a respective circuit breaker 16 within the power panel 10 draws excessive electrical current then the circuit breaker 16 trips or otherwise disconnects the electrical power to the load 18. In this manner, if a load shorts and thereafter draws excessive current then the circuit breaker will trip. Frequently the load will be a three-phase load having three wires provided thereto, with one or more corresponding circuit breakers.

In many business environments a set of electrical loads, such as motors, lighting, heating units, cooling units, machinery, etc., may be electrically interconnected to one or more circuits, each of which may be a single phase or multi-phase. Obtaining the total power usage of the business may be readily obtained by reading the power meter provided by the power utility. The power meter is normally electrically interconnected between the power panel and the power utility. In many circumstances, it is desirable to monitor the power consumption of individual loads or groups of loads. The use of power meters permits effective monitoring of the power consumption of particular loads. Also, a set of power meters permits effective sub-metering of different loads, buildings, or groups of loads to attribute and monitor the power usage of the business. For example, the power sub-metering may be used to attribute the power costs charged by the utility to different buildings, departments, or cost centers. The traditional approach to monitoring such power usage is to install a power meter at a location proximate the load itself. To install a typical power meter on a three phase load, a current sensor is located around each wire of the three phases and a voltage connection is electrically interconnected to each wire. Such a power meter is available from Veris Industries, LLC under the name H8035 Power Meter. Unfortunately, the installation of such a system is prone to configuration error by the installer.

What is desired is an effective power monitoring system.

The foregoing and other objectives, features, and advantages of the invention will be more readily understood upon consideration of the following detailed description of the invention, taken in conjunction with the accompanying drawings.

DETAILED DESCRIPTION OF PREFERRED EMBODIMENT

Figure 1:
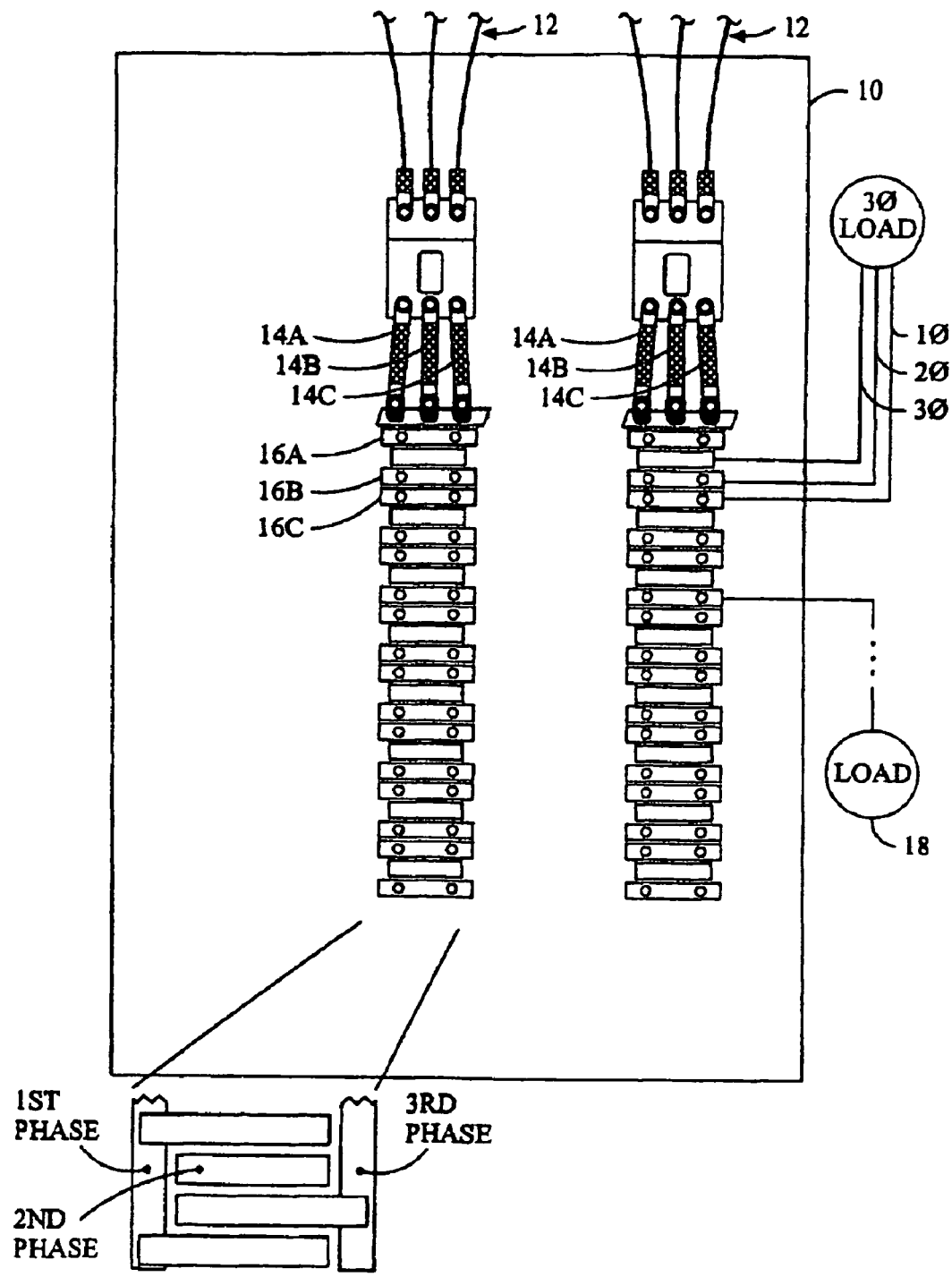
FIG. 1 illustrates a power panel with circuit breakers.
Figure 2:
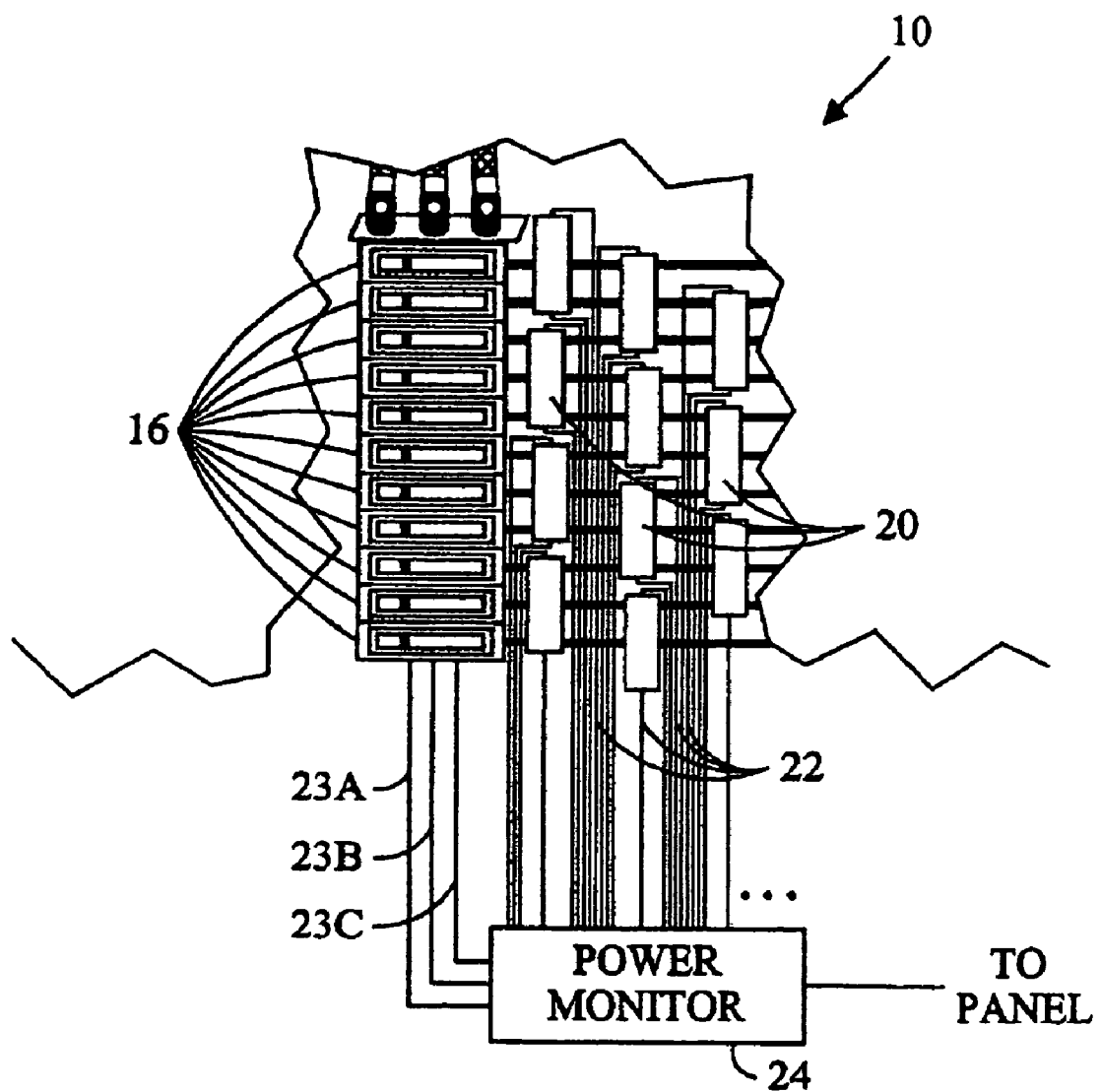
FIG. 2 illustrates circuit breakers, associated sensors, and a power monitor.

Referring to FIG. 2, to monitor the power provided to a particular load from one or more individual circuit breakers 16 a respective current sensor 20 may be interconnected to the wire on the load side of the respective circuit breaker 16. Typical circuit breakers may include a single phase, two phases, or three phases. The outputs 22 of each of the current sensors 20 may be interconnected to a power monitor 24. The current sensors 20 may be interconnected to one or more power monitors. Also, the current sensors 20 may likewise be daisy chained together, or interconnected to the power monitor(s) in any other suitable manner. An electrical interconnection from each bus bar to the power monitor(s) normally includes wires 23a, 23b, 23c, to sense the voltage and its corresponding phase relationship. Alternatively, the voltage potential and phase relationship for each phase may be sensed from locations other than the bus bars 14a, 14b, and 14c, such as for example, a wire provided to a load, the load side of a circuit breaker, the utility side of a circuit breaker, a capacitive coupling to the voltage potential, or the wire connection from the utility. It is to be understood that the power monitor may calculate power based upon a single phase, two phases, and/or three phases, etc., as desired. In essence, the power monitoring system may use the electrical path from the power monitor 24 to the bus bars (or otherwise) of at least one of the phases for a plurality of different loads. Typically, the power is calculated by multiplying the voltage, corresponding current, and corresponding power factor which relates to the phase relationship between the voltage and current. In some embodiments, the power monitor will not calculate power but provide the current measurements for each of the loads to the user.

Figure 3:
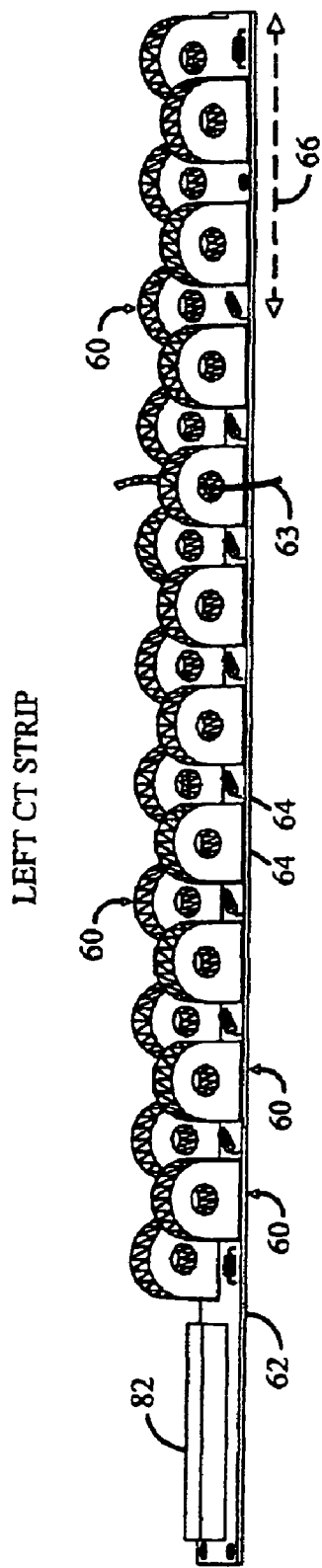
FIG. 3 illustrates a perspective view of an exemplary embodiment of a support for a set of current sensors.

Referring to FIG. 3, a set of sensors 60 may be supported by a support 62 which maintains the current sensors 60 in a fixed spatial relationship with respect to one another. Preferably the support 62 is rigid or semi-rigid, while a flexible support 62 that was installed on a rigid or a semi-rigid supporting member(s) may likewise be used. The sensors 60 are preferably current sensors, or alternatively, other types of sensors may be used. The sensors 60 are preferably wire wound torodial coils on a metallic or non-metallic core enclosed within a plastic housing through which a wire 63 may be extended, and the housings are at least partially surrounding the respective coil. Changing current within the wire 63 induces a changing magnetic field around the wire 63. The changing magnetic field in turn induces a changing current within the wire wound torodial coil. The changing current within the torodial coil may be used directly or converted to any suitable signal, such as for example, a voltage signal, or a different current signal.

The openings 64 defined by the sensors 60 are preferably oriented in a substantially parallel relationship with respect to each other and/or oriented in a substantially perpendicular relationship with respect to the longitudinal axis 66 of the support 62 or otherwise the general alignment of the sensors. Preferably, one set of the aligned sensors have a first linear arrangement and another set of the aligned sensors have a second linear arrangement, which may be parallel to each other. Also, preferably at least two of the aligned sensors have a first linear arrangement and at least two others of the aligned sensors have a second linear arrangement. A single aligned set of sensors 60 may be used or more than two sets of sensors 60 may be used, as desired.

Figure 4:
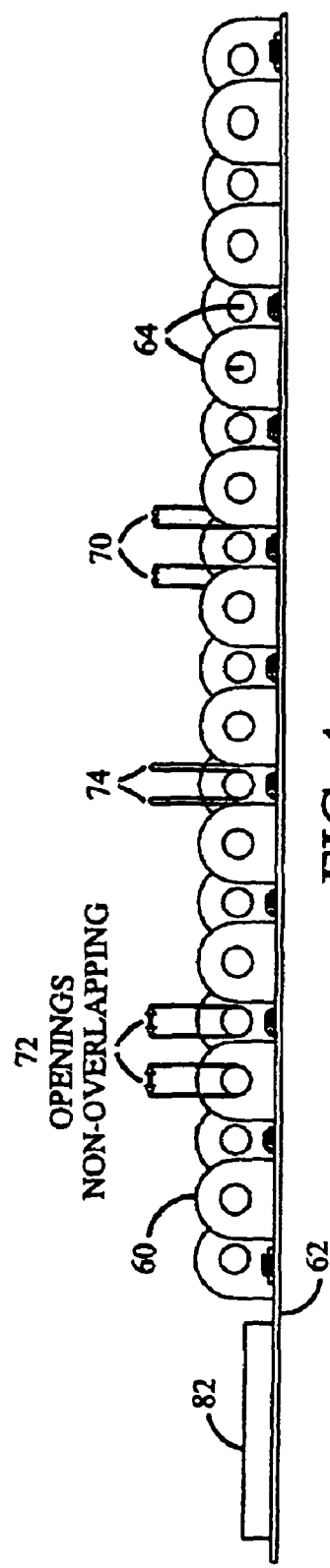
FIG. 4 illustrates a side view of the support and sensors of FIG. 3.

Referring also to FIG. 4, the sensors 60 may be arranged such that the housings surrounding the current sensors have an overlapping region 70 in a substantially perpendicular direction with respect to the longitudinal axis of the support 62 and/or general alignment of the sensors. Preferably, the openings 64 defined by the sensors 60 are in a non-overlapping relationship 72 with respect to one another and a non-overlapping relationship 74 with respect to other housings. This permits the sensors to be arranged in a more compact arrangement within the power panel.

Figure 5:
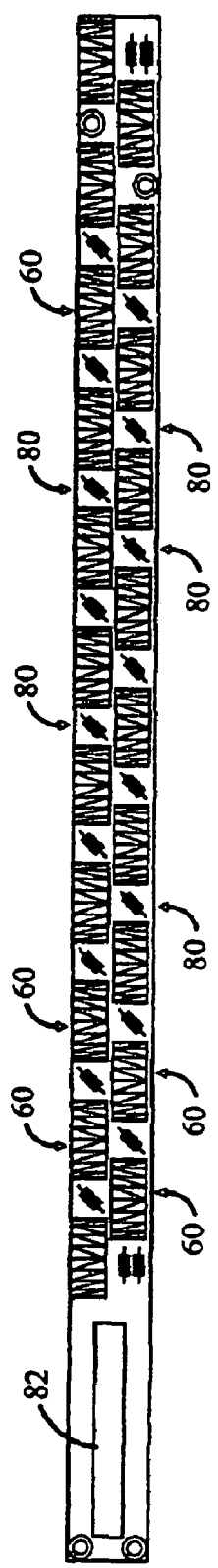
FIG. 5 illustrates a top view of the support and sensors of FIG. 3.

Referring also to FIG. 5, a respective transient voltage suppressor 80 may be interconnected in parallel across the output terminals of each sensor 60. The transient voltage suppressors 80 limits the voltage build up at the terminals of the sensors 60, which may occur if the sensors are sensing a changing magnetic field while the terminals of the sensors 60 are open circuited. This decreases the likelihood that technicians will be the recipient of an unanticipated electrical shock.

Figure 6:
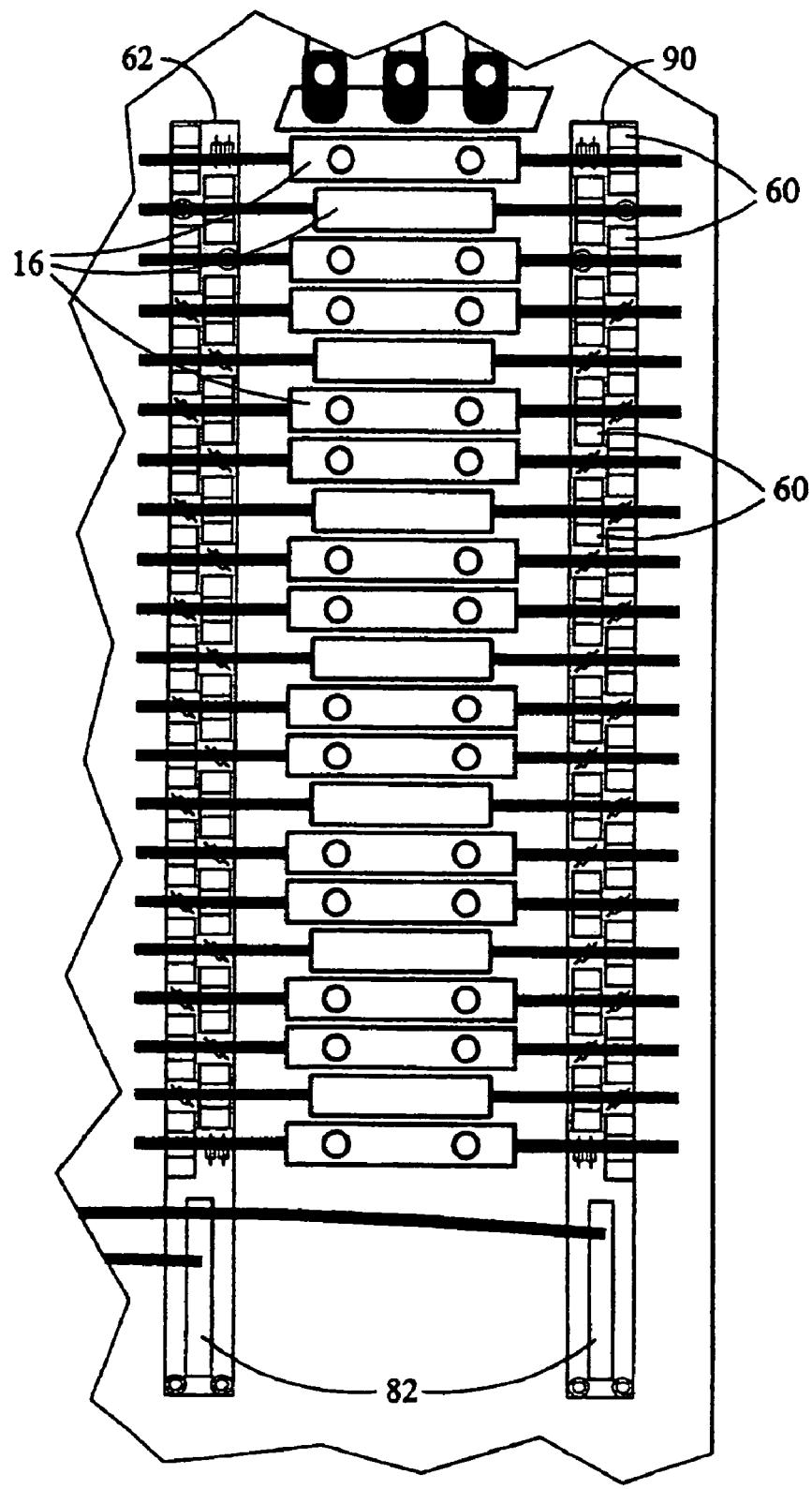
FIG. 6 illustrates a top view of the support and sensors of FIG. 2 together with circuit breakers.

Referring to FIG. 6, the current sensors 60 are preferably arranged in a spatial arrangement such that the openings 64 defined by the current sensors 60 are in a substantially directly opposing relationship with respect to the circuit breakers 16. In other words, the each of the openings 64 is opposing a respective circuit breaker 16. In this manner, the wires from the circuit breakers 16 may be readily routed through a respective sensor 60.

Figure 7:
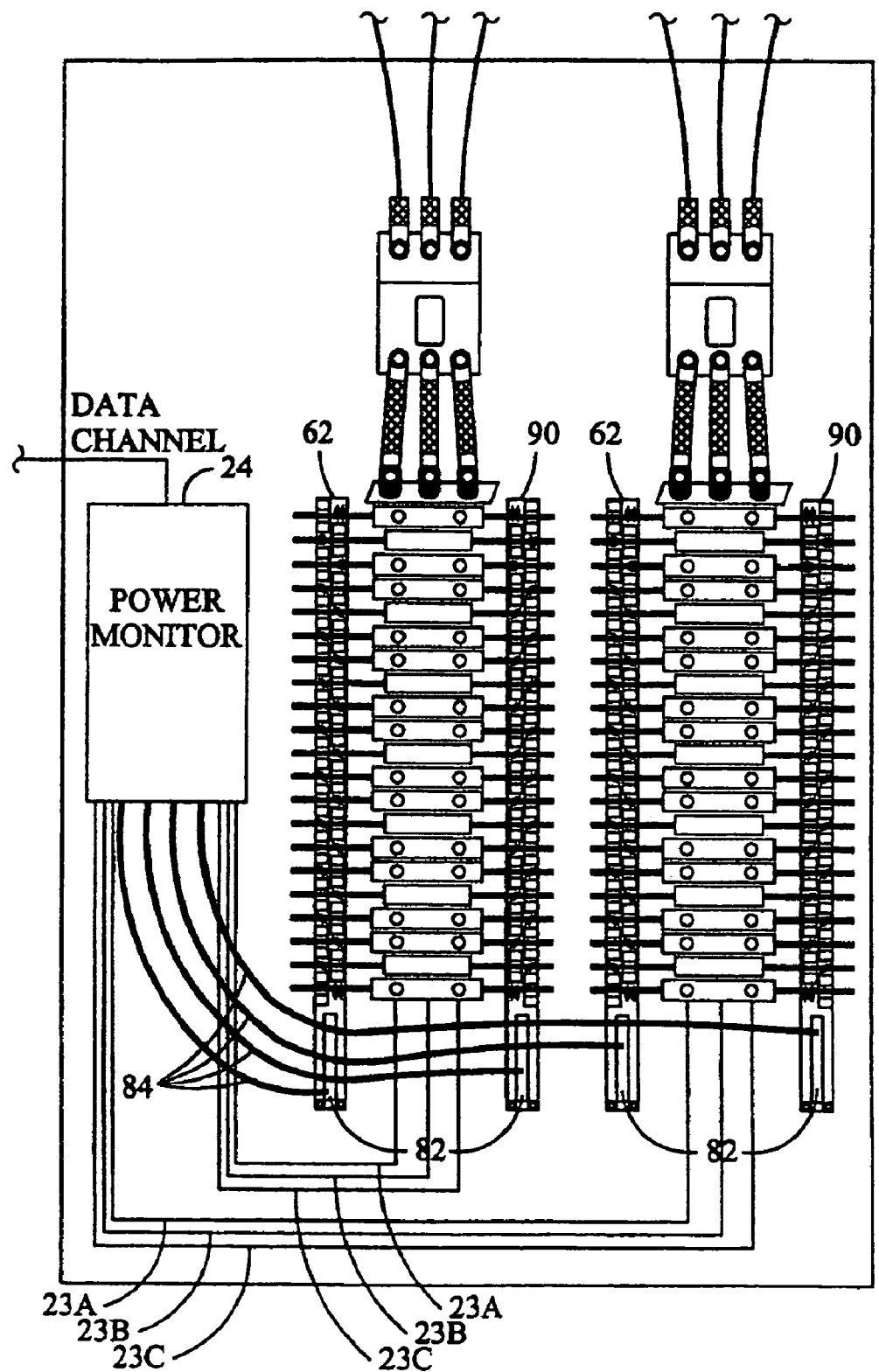
FIG. 7 illustrates a power panel assembly with a power monitor and the support/current sensors of FIG. 3 with a top feed.

Referring to FIG. 7, during normal installation the support 62 is initially affixed within the power panel in an adjacent spaced apart relationship with respect to a set of circuit breakers 16. A support may be located on both sides of a set of circuit breakers 16, if desired. Then, the wires from the loads are passed through the respective sensors and interconnected to a respective circuit breaker 16. In addition, the wires 23a, 23b, and 23c, for sensing the voltage potentials on the bus bars are likewise electrically interconnected. In this manner, the installation of the circuit breakers and the power monitor is efficient, less expensive, economical, and the sensors are in a suitable position with respect to the respective circuit breakers. The support 62 may be suitable for supporting a set of electrical traces that interconnect the sensors 60 to a connector 82. The interconnections from the sensors 60 to the connector 82 are predetermined so that the signals provided to the connector 82 are readily identifiable to the proper sensor 60. This eliminates the potential possibility of improperly interconnecting the wires from the sensors 60 to the connector. Thus on a strip to strip basis, the interrelationship between each of the sensors is predefined. Accordingly, at each respective connector it is known the relative relationship between each of the sensors. A cable 84 interconnects each connector 82 to a power monitor 24. While such a set of supports 62 with respective sensors 60 are suitable for use with new installation, it is difficult to install such a set of sensors 60 to an existing set of circuit breakers with wires already installed. To permit the sensors 60 to be readily interconnected with wires already interconnected to the circuit breakers 16 the sensors 60 may be constructed in a split-core manner. In this manner, the opening 64 may be opened, the wire inserted therein, and the opening 64 closed around substantially all of the wire. To provide effective monitoring of the power usage used by the loads, the power monitor 24 may monitor the current levels of each of circuit breakers 16 together with the associated voltage potential and phase relationship.

As long as the particular arrangement of the strips is consistent, then the power monitor 24 can be pre-programmed to calculate power (or provide current measurements) based upon the arrangement of the sensors relative to the circuit breakers. In this manner, the arrangement of circuit breakers is known and thus the current sensors on either side of the breakers is likewise known. With known relationships, the output of the power monitor provides data for each of the circuit breakers in a known and repeatable manner. Moreover, the potential for installation errors of the strips is greatly reduced.

Figure 8:
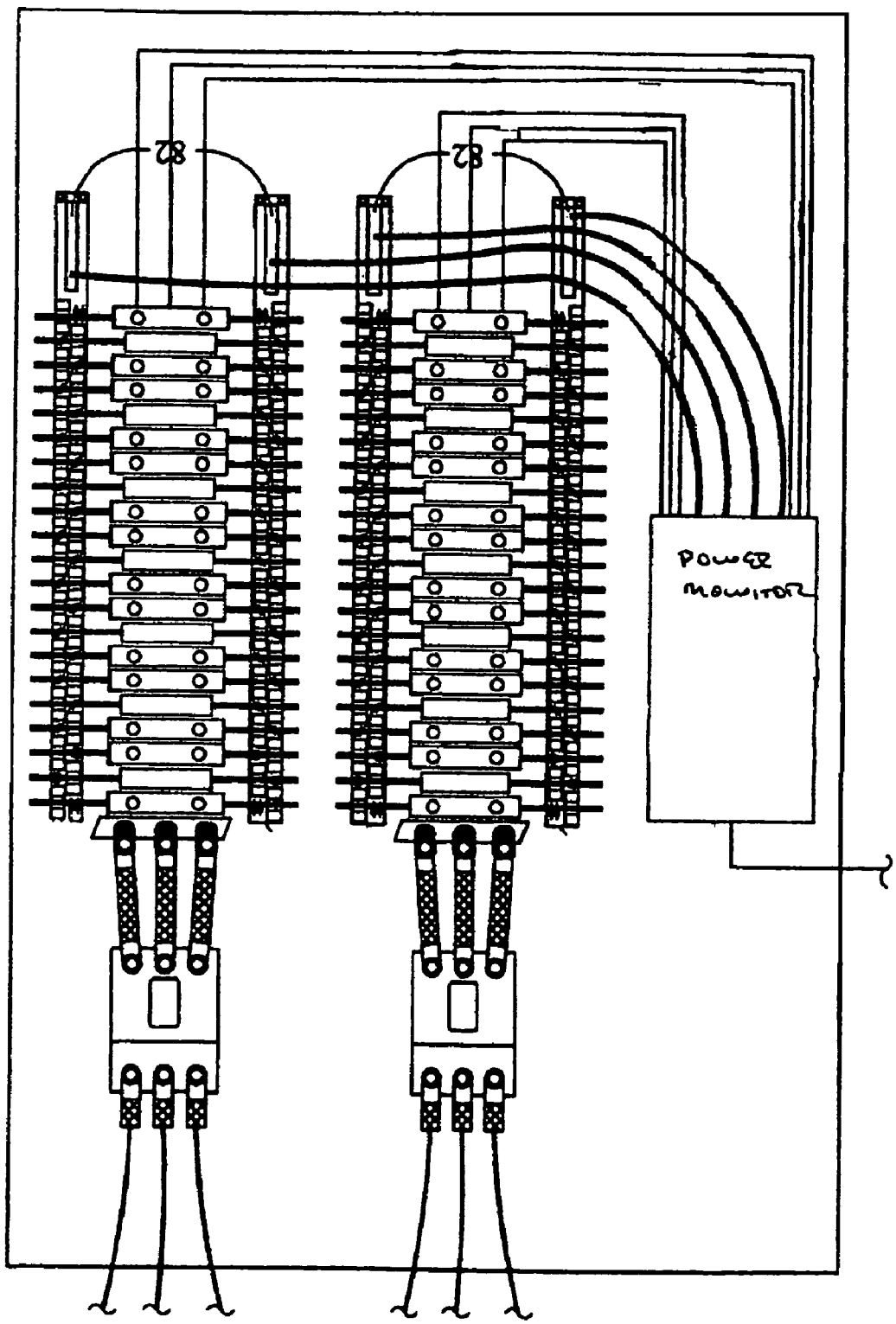
FIG. 8 illustrates a power panel assembly with a power monitor and the support/current sensors of FIG. 3 with a bottom feed.

In many cases, it is desirable to have the connectors 82 arranged distant from the utility connection for safety reasons. In actual installations depending on the particular configuration of the enclosure, the utility connection (i.e., any power connection from outside of the enclosure) may be at the top of the enclosure (as illustrated in FIG. 7) or at the bottom of the enclosure (as illustrated in FIG. 8). There exists some situations where the connectors are at one or both sides of the enclosure. With the strip configuration potentially being installed with different orientations, the same sensor would be associated with different circuit breakers. For example, the strip may be installed with the connector at the bottom or the connector at the top. Accordingly, it is desirable that the power monitor is capable of being configured to automatically account for the different configurations in a transparent manner to the user. In this manner, each circuit breaker is associated with a known sensor in a manner independent of the orientation of the strip.

Figure 9:
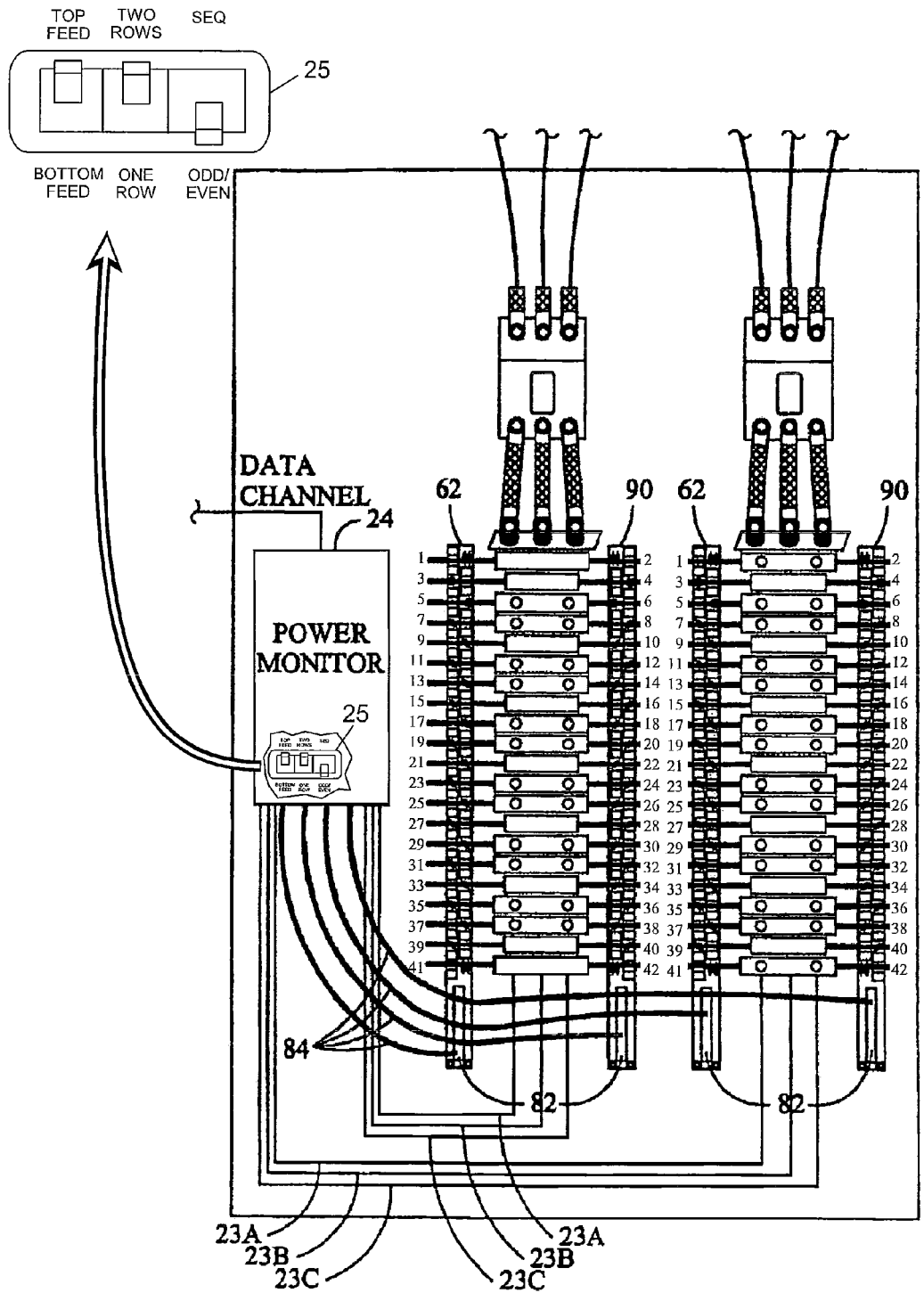
FIG. 9 illustrates a power panel assembly with a power monitor and the support/current sensors of FIG. 3 with a top feed and a numbering scheme.

Referring to FIG. 9, for a top feeding panel the power connectors are at the top of the panel. The circuit breakers are normally arranged in a vertical orientation, in either one or two columns. The connectors 82 are preferably at the bottom of the circuit panel. Accordingly, this configuration may be referred to as a top feed panel. The sensors may have a numbering convention with the odd numbered sensors on the left and the even numbered current sensors on the right. Each of the odd numbers and even numbers are arranged in a sequential manner from top to bottom. In this manner, the power monitor is configured to know the physical position of the upper left hand circuit breaker as being associated with sensor 1, the second upper left hand circuit breaker as being associated with sensor 3, and so forth. Other numbering conventions may likewise be used.

Figure 10:
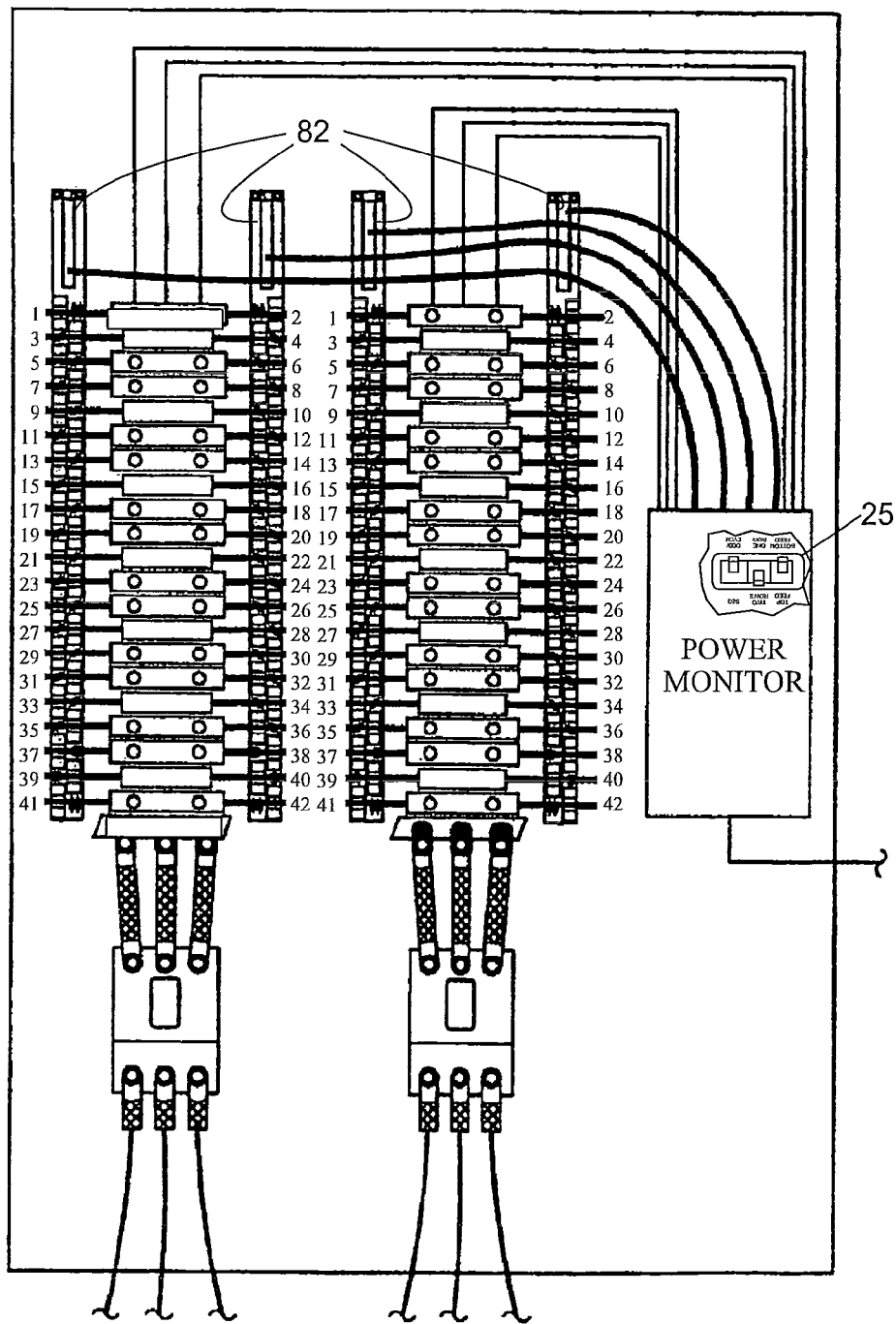
FIG. 10 illustrates a power panel assembly with a power monitor and the support/current sensors of FIG. 3 with a bottom feed and a numbering scheme consistent with FIG. 9.

Referring to FIG. 10, for a bottom feeding panel the power connectors are at the bottom of the panel. The circuit breakers are normally arranged in a vertical orientation, in either one or two columns. The connectors 82 are preferably at the top of the circuit panel. Accordingly, this configuration may be referred to as a bottom feed panel. The sensors may have a numbering convention with the odd numbered sensors on the left and the even numbered current sensors on the right. Each of the odd numbers and even numbers are arranged in a sequential manner from top to bottom. In this manner, the power monitor is configured to know the physical position of the upper left hand circuit breaker as being associated with sensor 1, the second upper left hand circuit breaker as being associated with sensor 3, and so forth. Other numbering conventions may likewise be used.

A switch 25 or other identification mechanism may be used by the power monitor to distinguish between a top feeding (FIG. 9) and a bottom feeding configuration (FIG. 10). The switch or other identification mechanism may likewise be used to distinguish between other configurations. The power monitor then makes the appropriate substitutions of the sensed values to provide an output that is consistent between the top feeding and bottom feeding configurations (or other configurations). In either case, from the user's perspective the top feeding and bottom feeding configurations (or other configurations) are the same.

Figure 11:
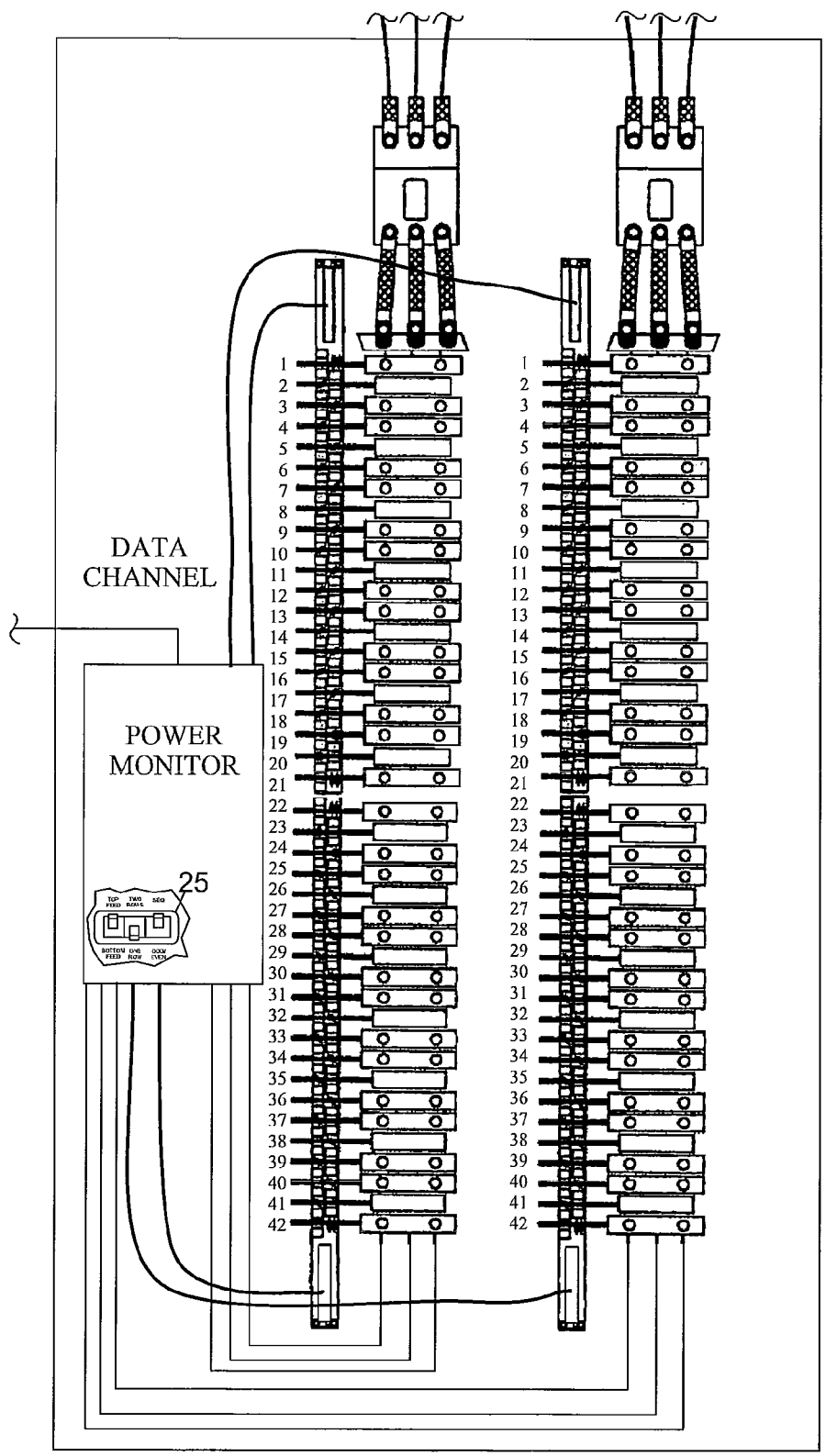
FIG. 11 illustrates a power panel assembly with a power monitor and the support/current sensors of FIG. 3 with a top feed and a sequential numbering scheme.

Referring to FIG. 11, there are situations where multiple strips are desirable in order to accommodate a series of circuit breakers that are longer than a single strip. It is desirable to have a numbering scheme that is consistent between different configurations. For a top feeding panel the power connectors are at the top of the panel. The circuit breakers are normally arranged in a vertical orientation, in either one or two columns. The connectors 82 are preferably at the top of the circuit panel and the bottom of the circuit panel on one side of the circuit breakers. Accordingly, this configuration may be referred to as a top feed panel single row. The sensors may have a numbering convention with the sensors numbered in a sequential manner from top to bottom. Each of the strips are sequentially numbered between strips. In this manner, the power monitor is configured to know the physical position of the upper left hand circuit breaker as being associated with sensor 1, the second upper left hand circuit breaker as being associated with sensor 2, and so forth.

Figure 12:
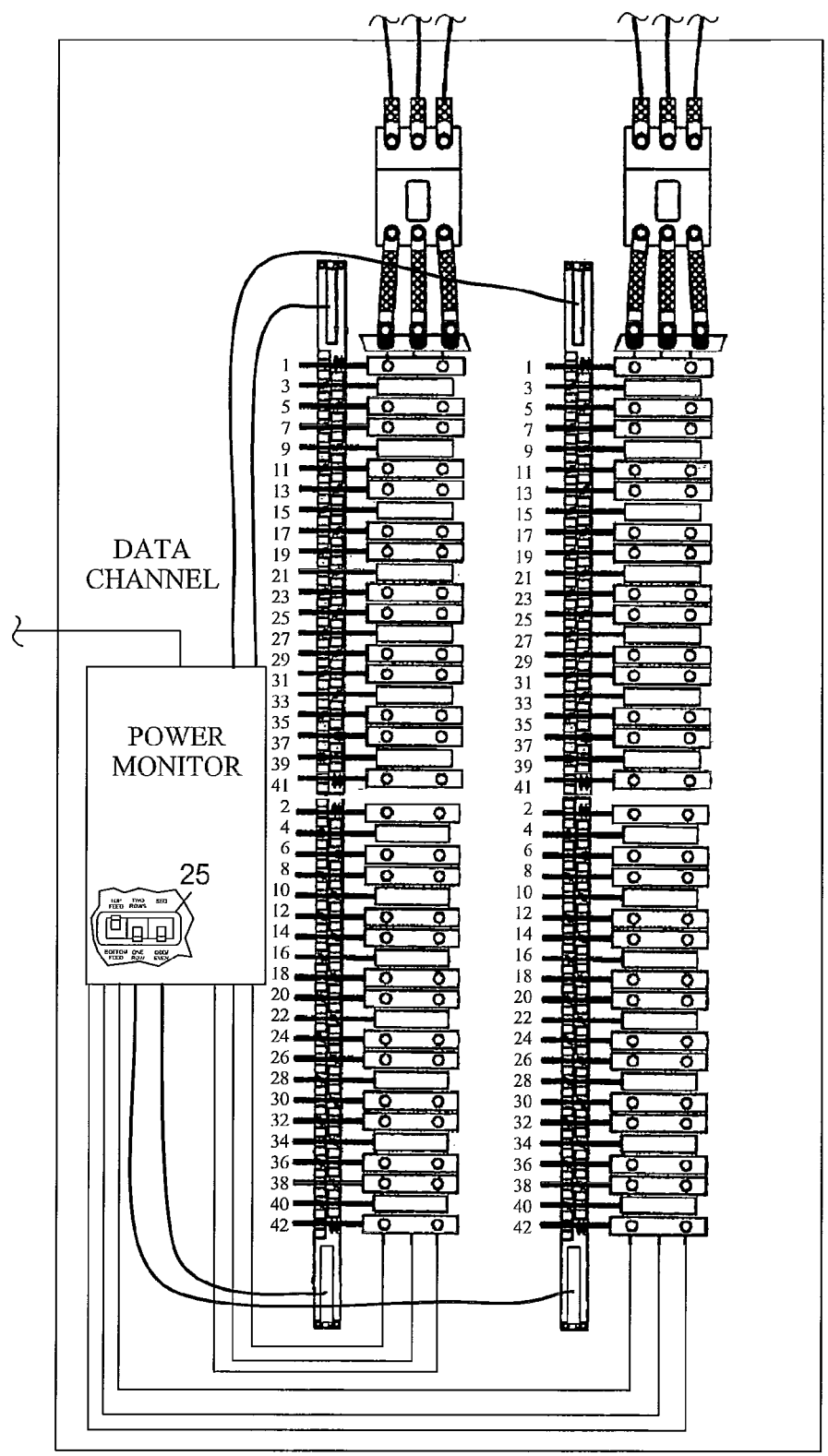
FIG. 12 illustrates a power panel assembly with a power monitor and the support/current sensors of FIG. 3 with a top feed and an even/odd numbering scheme.

Referring to FIG. 12, there are situations where multiple strips are desirable in order to accommodate a series of circuit breakers that are longer than a single strip. It is desirable to have a numbering scheme that is consistent between different configurations. For a top feeding panel the power connectors are at the top of the panel. The circuit breakers are normally arranged in a vertical orientation, in either one or two columns. The connectors 82 are preferably at the top of the circuit panel and the bottom of the circuit panel on one side of the circuit breakers. Accordingly, this configuration may be referred to as a top feed panel single row. The sensors may have a numbering convention with the sensors numbered in a sequential even manner from top to bottom of the upper strip and sequential odd manner from top to bottom of the lower strip. In this manner, the power monitor is configured to know the physical position of the upper left hand circuit breaker as being associated with sensor 1, the second upper left hand circuit breaker as being associated with sensor 3, and so forth. Moreover, the strips may be configured such that they are suitable for top feeding or bottom feeding configuration. In either case, the numbering scheme between top feeding and bottom feeding configurations should be the same.

Figure 13:
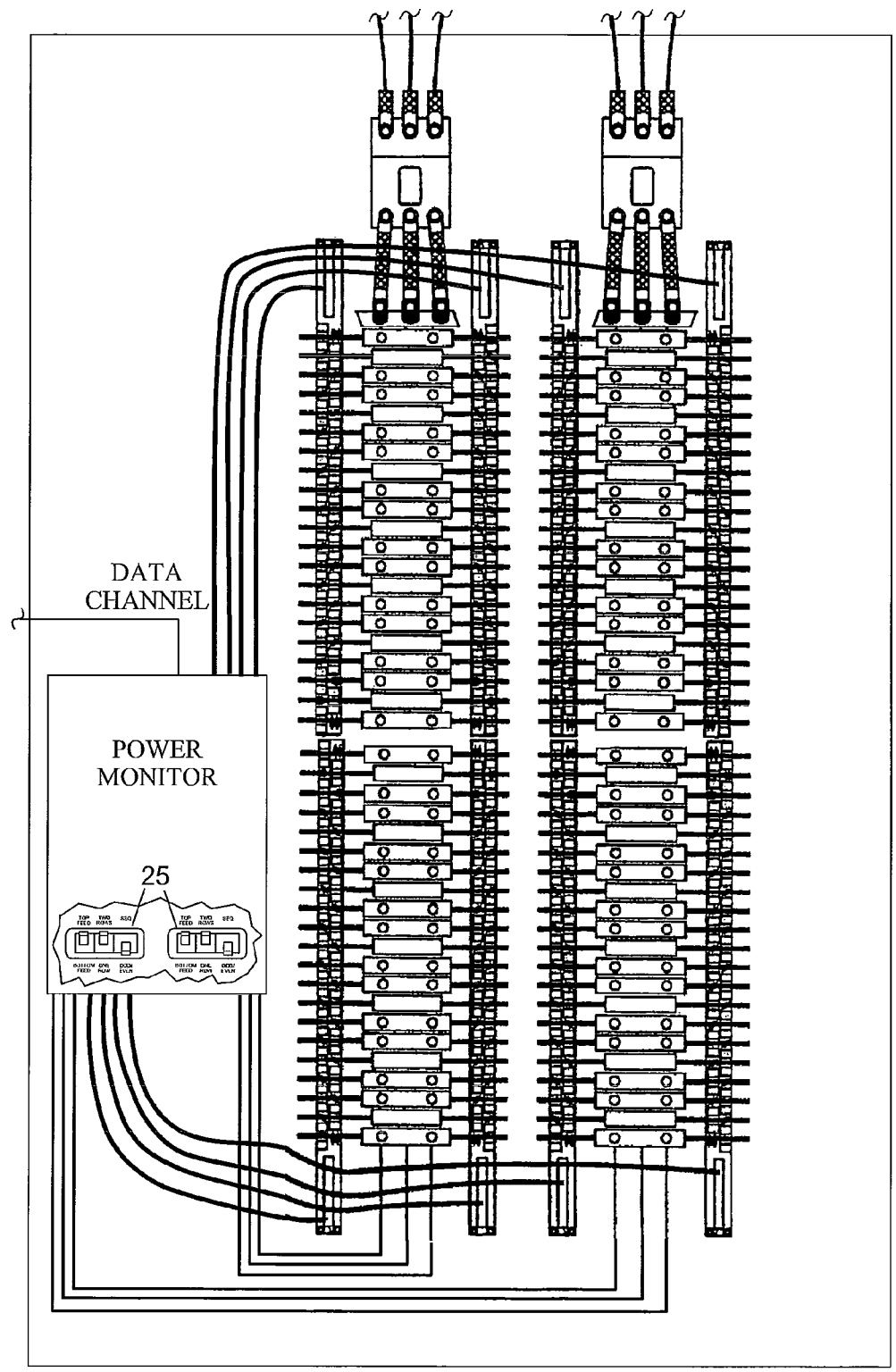
FIG. 13 illustrates a power panel assembly with a power monitor and the support/current sensors of FIG. 3 with a top feed and dual columns of sensors.

Referring to FIG. 13, the strips may be configured to be on both sides of the circuit breakers, if desired. In such a both sides configuration, the number scheme for the strips may be similar to that illustrated in FIG. 9 and/or FIG. 10 and/or FIG. 11 and/or FIG. 12. Moreover, the strips may be configured such that they are suitable for top feeding or bottom feeding configuration. In either case, the numbering scheme between top feeding and bottom feeding configurations should be the same.

It takes considerable time to install, at significant expense, all of the strips within the available space within the power panel. Because of the potential significant number of individual strips an installer has a significant tendency to interconnect the strips improperly within the enclosure. Moreover, it is problematic to ensure that the strips installed by the installer relate to a particular current sensor. In summary, the potential installation problems are significant, especially when install by untrained technicians.

In an alternative embodiment the power factor for one or more phases may be presumed to be a constant value. The power factor (normally the cosine of the phase difference) may be based upon historical measurements, test measurements, anticipated power factor, desired power factor, or otherwise omitted from the calculation of power usage (equivalent to using a power factor of "1").

In an alternative embodiment the power factor, the voltage potential, and/or the current may be calculated, sensed, or otherwise measured for a single phase of a multi-phase load. The power monitor may then use the voltage potential and current, together with the power factor if desired, to calculate the power usage of a multi-phase load by presuming that the remaining phases have similar characteristics. For example, in a three phase system the remaining phases may be presumed to have approximately a 60 degree phase difference. Reusing power calculations for other phases reduces the computation complexity of the power monitor while maintaining relatively accurate power measurements. In another alternative embodiment, the power factor of a multi-phase load may be determined based upon one of the voltages and one of the currents, both of which are preferably associated with the same phase. The power factor may then be used for all of the phases, if desired. Reusing the calculated power factor reduces the computational complexity of the power monitor while maintaining relatively accurate power measurements. In yet another alternative embodiment, the power monitor may, if desired, separate multiple summed alternating voltage signals into their respective phases for power determination, typically by decomposition of the composite signal. In a further alternative embodiment, multiple electrical interconnections may be provided from the power monitor to each of the multiple bus bars or otherwise the voltage potentials of the different phases. Preferably, at least one of the electrical interconnections from the power monitor to at least one of the multiple bus bars, or otherwise the voltage potential of at least one phase, is used together with different current sensors for a plurality of different loads. In a further alternative embodiment, all or a portion of the power monitoring system may be located outside of the power panel.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A system for monitoring electrical energy in a plurality of conductors, said system comprising:
   (a) an elongate sensor array comprising plural sensors spaced apart and joined to each other, each sensor arranged to sense electrical energy in a respective conductor;
   (b) an identification mechanism operable to distinguish a sensor array configuration comprising an orientation of said sensor array; and
   (c) a monitor arranged to quantify an output of the respective ones of said plural sensors, said monitor associating a quantified sensor output with a first sensor of said array if a first array orientation is distinguished by said identification mechanism and associating said quantified output with a second sensor of said sensor array if a second array orientation is distinguished.

2. The system for monitoring electrical energy of claim 1 wherein said identification mechanism comprises a switch operable to distinguish said first array orientation if a reference feature of said sensor array is located distal of a mid-point of a longitudinal axis of said elongate sensor array in a first direction and to distinguish said second array orientation if said reference feature is located distal of said mid-point in a second direction.

3. The system for monitoring electrical energy of claim 1 further comprising a second elongate sensor array comprising a second plurality of sensors, said monitor arranged to associate a second quantified sensor output with a first sensor of said second sensor array if said first array orientation is distinguished by said identification mechanism for said second sensor array and to associate said second quantified output with a second sensor of said second sensor array if said second array orientation is distinguished for said second sensor array by said identification mechanism.

4. The system for monitoring electrical energy of claim 3 wherein said identification mechanism comprises a switch operable to enable said monitor to associate said first quantified output with said first sensor of said first sensor array if said first sensor array is secured with a reference feature of said first sensor array located above a mid-point of a longitudinal axis of said elongate first sensor array and to associate said first quantified output with said second sensor of said first sensor array if said reference feature is located below said mid-point of said longitudinal axis of said first sensor array and to associate said second quantified output with said first sensor of said second sensor array if said second sensor array is secured with a reference feature of said second sensor array located above a midpoint of a longitudinal axis of said second sensor array and to associate said second quantified output with said second sensor of said second sensor array if said reference feature is located below said midpoint of said longitudinal axis of said second sensor array.

5. A system for monitoring electrical energy in a plurality of conductors, said system comprising:
   (a) a first elongate sensor array comprising plural sensors spaced apart and joined to each other, each sensor arranged to sense electrical energy in a respective conductor;
   (b) a second elongate sensor array comprising plural sensors spaced apart and joined to each other, each sensor arranged to sense electrical energy in a respective conductor;
   (c) an identification mechanism operable to distinguish an association sequence of said sensors of said first sensor array and said sensors of said second sensor array; and
   (d) a monitor arranged to quantify an output of the respective ones of said plural sensors, said monitor associating a first quantified sensor output with a sensor of said first array and, if a first association sequence is distinguished, associating a second quantified output with a second sensor of said first sensor array and, if a second association sequence is distinguished, associating said second quantified output with a sensor of said second sensor array.

6. The system for monitoring electrical energy of claim 5 wherein said monitor is further arranged to associate a third measurement with a third sensor of said first sensor array if said first association sequence is distinguished by said identification mechanism and to quantify said third measurement with a second sensor of second of first sensor array if said second association sequence is distinguished.

7. The system for monitoring electrical energy of claim 5 wherein said identification mechanism comprises a switch.

8. A system for monitoring electrical energy in a plurality of conductors, said system comprising:
   (a) a first elongate sensor array comprising plural sensors spaced apart and joined to each other, said sensors arranged to sense electrical energy in respective conductors;
   (b) a second elongate sensor array comprising plural sensors spaced apart and joined to each other, said sensors arranged to sense electrical energy in respective conductors;
   (c) an identification mechanism operable to distinguish:
      (i) an array orientation of said first sensor array
      (ii) an array orientation of said second sensor array; and
      (iii) an association sequence for said sensors of said first sensor array and sensors of said second sensor array; and
   (d) a monitor arranged to quantify an output of the respective ones of said plural sensors, said monitor associating a first quantified sensor output with a first sensor of said first sensor array if a first array orientation is distinguished for said first sensor array and associating said first quantified output with a second sensor of said first sensor array if a second array orientation is distinguished for said first sensor array and associating a second quantified output with a third sensor of said first sensor array if a first association sequence is distinguished and, if a second association sequence is specified for said sensors of said first sensor array and said second sensor array, associating said second quantified sensor output with a first sensor of said second array if a first array orientation is distinguished for said second sensor array and associating said second quantified sensor output with a second sensor of said second sensor array if a second array orientation is distinguished for said second sensor array.

9. The system for monitoring electrical energy of claim 8 wherein said identification mechanism is operable to distinguish:
   (a) for said first sensor array, one of said first array orientation if a reference feature of said first sensor array is located distal of a mid-point of a longitudinal axis of said elongate first sensor array in a first direction and said second array orientation if said reference feature of said first sensor array is located distal of said mid-point of said longitudinal axis of said first sensor array in a second direction;

(b) for said second sensor array, one of said first array orientation if a reference feature of said second sensor array is located distal of a mid-point of a longitudinal axis of said elongate second sensor array in a first direction and said second array orientation if said reference feature of said second sensor array is located distal of said mid-point of said longitudinal axis in a second direction; and (c) for said sensors of said first sensor array and said second sensor array, a first association sequence if a sensor output is to be associated with each of said sensors of said first sensor array before a sensor output is associated with one of said sensors of said second sensor array and a second association sequence if association of said first sensor output with a sensor of said first sensor array is to be followed by association of a next sensor output with a sensor of said second sensor array.

10. The system for monitoring electrical energy of claim 9 wherein the identification mechanism comprises a switch.

11. The system for monitoring electrical energy of claim 8 wherein said monitor is further arranged to associate a third measurement with a third sensor of said first sensor array if said first association sequence is distinguished with said identification mechanism and to associate said third measurement with a third sensor of said second sensor array if said second association sequence is distinguished.

12. A method of monitoring electricity in a plurality of conductors, said method comprising the steps of:
(a) arranging a first elongate sensor array comprising plural sensors joined to each other so that the ones of said plural sensors can each sense energy in a respective conductor;
(b) with an identification mechanism, distinguishing for a power monitor connectable to said first sensor array an array orientation of said first sensor array;
(c) quantifying a first sensor output with said power monitor; and
(d) associating with said power monitor said first quantified sensor output with a first sensor of said first sensor array if a first array orientation is distinguished and associating said first quantified sensor output with a second sensor of said first sensor array if a second array orientation is distinguished.

13. The method of monitoring electricity in a plurality of conductors of claim 12 wherein the step of distinguishing an orientation of said first sensor array comprises the steps of:
(a) selecting a first array orientation for said first sensor array if said first sensor array is arranged with a reference feature of said first sensor array located distal of a midpoint of a longitudinal axis of said first sensor array in a first direction; and
(b) selecting a second array orientation for said first sensor array if said first sensor array is arranged with said reference feature of said first sensor array located distal of said midpoint of said longitudinal axis in a second direction.

14. The method of monitoring electricity in a plurality of conductors of claim 12 further comprising the steps of:
(a) arranging a second elongate sensor array comprising plural sensors joined to each other so that the ones of said plural sensors can each sense energy in a respective conductor;
(b) with said identification mechanism, distinguishing for said power monitor a spatial relationship of said second sensor array to said first sensor array; and
(c) distinguishing with said identification mechanism one of:
(i) a first sensor output sequence causing said power monitor to associate a second quantified sensor output with a first sensor of said second sensor array and a third quantified sensor output with a third sensor of said first sensor array; and
(ii) a second sensor output sequence causing said power monitor to associate said second quantified sensor output with said third sensor of said first sensor array and when a quantified sensor output has been associated with each sensor of said first sensor array, associate another quantified sensor output with a sensor of said second sensor array.

15. The method of monitoring electricity in a plurality of conductors of claim 14 wherein the step of distinguishing a spatial relationship of said first sensor array and said second sensor array comprises the steps of:
(a) selecting a first spatial relationship if said first sensor array and said second sensor array are spatially arranged so that said reference feature of said first sensor array and a corresponding reference feature of said second sensor array are situated in the same direction relative to said midpoint of said longitudinal axis of said first sensor array; and
(b) selecting a second spatial relationship if said first sensor array and said second sensor array are spatially arranged so that said reference feature of said first sensor array and said corresponding reference feature of said second sensor array are situated in opposite directions relative to said midpoint of said longitudinal axis of said first sensor array.

16. The method of monitoring electricity in a plurality of conductors of claim 12 wherein the step of distinguishing an array orientation of said first sensor array comprises the steps of:
(a) selecting a first array orientation for said first sensor array if said first sensor array is arranged with a reference feature of said first sensor array located above a midpoint of a longitudinal axis of said first sensor array; and
(b) selecting a second array orientation for said first sensor array if said first sensor array is arranged with said reference feature of said first sensor array located below said midpoint of said longitudinal axis of said first sensor array.

* * * * *